April 1, 1969 O. P. HART 3,436,681
FIELD-EFFECT OSCILLATOR CIRCUIT WITH FREQUENCY CONTROL
Filed June 26, 1967
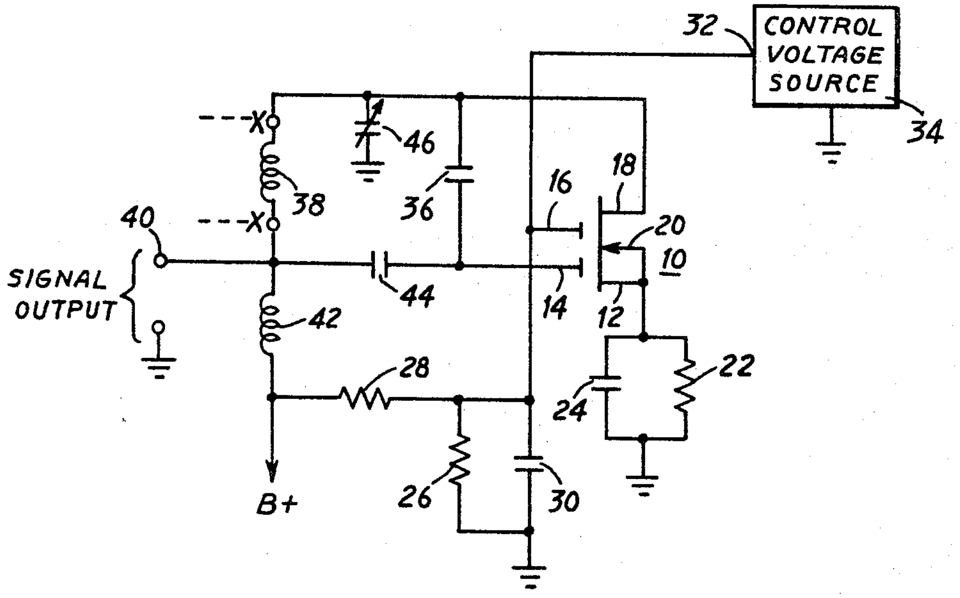
INVENTOR
OLIVER P. HART
BY Eugene M. Whitacre
ATTORNEY United States Patent Office 3,436,681

Patented Apr. 1, 1969

3,436,681

FIELD-EFFECT OSCILLATOR CIRCUIT WITH FREQUENCY CONTROL

Oliver P. Hart, Berkeley Heights, N.J., assignor to Radio Corporation of America, a corporation of Delaware Filed June 26, 1967, Ser. No. 648,775
Int. Cl. H03b 5/02
U.S. Cl. 331—117 4 Claims

ABSTRACT OF THE DISCLOSURE

An oscillator circuit includes an insulated dual gate field-effect transistor. A frequency controlling voltage is applied to the second gate electrode of the transistor to effect a change in the frequency of oscillation.

This invention relates to oscillator circuits, and more particularly to frequency control of oscillator circuits employing insulated multiple gate field-effect transistors as the active elements thereof. Insulated multiple gate field-effect transistors have two or more gate electrodes in addition to the source, drain, and substrate electrodes.

An oscillator circuit embodying the invention includes an insulated dual gate field-effect transistor. A frequency controlling voltage is applied to the second gate electrode to cause the frequency of oscillation to change as a function of the magnitude of the applied voltage. In addition, the oscillator output signal amplitude versus second gate electrode voltage characteristic is such that over a range of second gate electrode voltages, the amplitude of the oscillator output voltage remains substantially constant as the frequency of oscillation changes.

The novel features which are considered characteristic of the invention are set forth with particularity in the appended claims. The invention, however, will best be understood from the following description when read in connection with the accompanying drawing in which a schematic circuit diagram of an oscillator embodying the invention is illustrated.

The drawing shows an oscillator circuit suitable for use in the tuner of a television receiver. The circuit includes an insulated gate field-effect transistor 10 having source, first gate, second gate and drain electrodes 12, 14, 16 and 18 respectively, and a substrate electrode 20. In the illustrated embodiment, the field-effect device 10 is of a type referred to as an N-channel insulated dual gate transistor, and may for example comprise an RCA type TA2644 or TA7149. It will be understood that the transistor first gate electrode 14 is physically closer to the source electrode 12 than the second gate electrode 16.

As is illustrated, the transistor substrate electrode 20 is directly connected to the source electrode 12 and the source electrode is coupled to ground through a resistor 22. Resistor 22 is bypassed to ground at signal frequencies by a capacitor 24. Self bias for the first gate electrode 14 with respect to the source electrode 12 is thereby provided by means of a voltage developed across the resistor 22 during operation of the circuit. A suitable bias for the second gate electrode 16 is established by a connection therefrom to the junction of a pair of voltage dividing resistors 26 and 28 connected between ground and a source of operating potential B+. The second gate electrode 16 is bypassed to ground at signal frequencies by a capacitor 30. Connection is also made from the second gate electrode 16 to an output terminal 32 of a frequency controlling voltage source 34. In the present case, the source 34 provides a D.C. voltage at its output terminal which, either adds to or decreases the bias voltage on the transistor second gate electrode 16, depending upon the direction of frequency change desired, as will be hereinafter explained.

The transistor output circuit includes a capacitor 36 connected between the transistor drain and first gate electrodes 18 and 14, and an inductor 38 connected between the drain electrode 18 and an oscillator signal output terminal 40. B+ operating potential is supplied to the transistor drain electrode 18 through an R.F. choke 42 connected between the output terminal 40 and the B+ source. A D.C. blocking capacitor 44 is connected between the output terminal 40 and the transistor first gate electrode 14.

The nominal operating frequency of the oscillator is determined by a resonant network which includes the inductor 38, capacitors 36 and 44, the input capacitance (not shown) of the transistor first gate electrode referenced to ground, and the output capacitance (not shown) of the transistor drain electrode referenced to ground, as well as a variable trimmer capacitor 46 connected between ground and the transistor drain electrode 18.

As will be understood by those familiar with the art, inductor 38 may be one of a plurality of inductors that may be switched into the resonant frequency network of the oscillator by operation of a channel switch mechanism in the tuner (not shown). In the drawing, therefore, the symbol X—X interposed at opposite ends of the inductor 38 represents switching contacts through which this inductor is connected in the resonant network to determine the circuit frequency of oscillation.

It has been observed that a change in the magnitude of the bias voltage on the second gate electrode causes a change in the frequency of oscillation. When the voltage applied to the second gate electrode is increased in a polarity direction which tends to increase the device gain, the effect is to decrease the frequency of oscillation. Conversely, decreasing the second gate electrode voltage causes an increase in the frequency of oscillation. Thus, by varying the voltage on the second gate electrode by the application of some error or frequency correcting voltage which may be an automatic frequency control voltage as represented by the control voltage source 34, the circuit frequency of oscillation can be made to vary about a nominal frequency. The specific circuitry for deriving the automatic frequency control voltage may be of any suitable type, and has not been shown.

In has been further observed as characteristic of the dual insulated gate field-effect transistor that the amplitude of the oscillatory output of the circuit remains substantially constant over a particular range of second gate bias voltages. Over this range, the transconductance ($g_{m2}$) of the second gate electrode to the drain electrode is substantially zero and there is no effective change in the transconductance ($g_{m1}$) of the first gate electrode. For example, for an RCA type TA7149 insulated dual gate MOS transistor, this range of zero $g_{m2}$ has been found to occur in the area of from +2 to +10 volts D.C. for television R.F. frequencies.

The values of the voltage dividing resistors 26 and 28 are chosen to provide an initial bias on the second gate electrode of approximately +6 volts D.C., midway in its constant gain or zero $g_{m2}$ range. A frequency controlling D.C. voltage which may be representative of some correction to be applied to the nominal frequency of the oscillator is then applied to the second gate electrode 16. The effect of this voltage is to cause the transistor input and output capacities to change in value and thereby affect the circuit frequency of oscillation such that the operating frequency is decreased or increased depending upon the polarity excursion of the applied control voltage. It will be appreciated that by operating the second gate electrode in its constant gain range, the frequency of oscillation can be shifted, i.e., changed, without substantially varying the amplitude of the output oscillatory signal.

A particular set of values for the circuit shown in the drawing which has provided satisfactory operation is set forth below. It will be appreciated that those values are given by way of example only.

| | |
|---|---|
| Transistor **10** | RCA Type TA7149. |
| Resistor **22** | 62 ohms. |
| Resistor **26** | 62,000 ohms. |
| Resistor **28** | 120,000 ohms. |
| Capacitor **24** | 1,000 picofarads. |
| Capacitor **30** | 1,000 picofarads. |
| Capacitor **36** | 1.5 picofarads. |
| Capacitor **44** | 8.2 picofarads. |
| Capacitor **46** | 0.5–3.0 picofarads. |
| Inductor **38** | Approximately 9 turns of #34 gauge wire. |
| Coke **42** | 0.68 microhenry. |
| B+ | +17 volts. |

It is to be understood that a P-channel field-effect transistor could be utilized in place of the N-channel transistor shown, with corresponding changes in the polarity of the operating potential and the polarity of the voltage obtained from the control voltage source 34.

It will be further understood that the principles disclosed heerin are applicable to oscillator circuits employing field-effect semiconductor devices having more than two gate electrodes.

What is claimed is:

1. In combination:

an insulated gate field-effect transistor having a source, drain, and first and second gate electrodes, means connecting said transistor electrodes to form an oscillator circuit wherein the frequency of oscillation of said circuit is determined in part by the input and output interelectrode capacities exhibited by said transistor; and means including a controllable voltage source coupled to the second gate electrode so as to cause a change in the input and output interelectrode capacities exhiibted by said transistor, thereby to effect a change in the oscillator circuit frequency of oscillation.

2. The combination as defined in claim 1 wherein said oscillator circuit has an oscillator output signal amplitude versus second gate electrode voltage characteristic such that the amplitude of the signal output of said circuit is substantially constant over a range of second gate electrode voltages, said combination further including means for biasing said transistor in said range of second gate electrode voltages.

3. In combination:

an insulated gate field-effect transistor having a source, drain, and first and second gate electrodes;

means connecting said transistor electrodes to form an oscillator circuit, said circuit having an oscillator output signal amplitude versus second gate electrode voltage characteristic wherein the amplitude of the signal output of said circuit is substantially constant over a range of second gate electrode voltages, and wherein the circuit frequency of oscillation is determined in part by the input and output interelectrode capacities exhibited by said transistor, and which varies as a function of the magnitude of said second gate electrode voltage;

means for biasing said transistor in said range of second gate electrode voltages;

means providing a source of frequency control voltage; and means coupling said source of frequency control voltage to said transistor second gate electrode to cause the voltage theeron to vary over said range, thereby to change the circuit frequency of oscillation.

4. In a signal receiver an oscillator circuit comprising:

an insulated gate field-effect transistor having a source electrode, a drain electrode, and first and second gate electrodes disposed in the order named between said source and drain electrodes;

circuit means interconnecting said source, drain and first gate electrodes for operation as an oscillation generator wherein the frequency of oscillation of said circuit is determined in part by the input and output interelectrode capacities exhibited by said transistor;

means providing a source of automatic frequency control voltage; and means for applying said automatic frequency control voltage between said second gate electrode and said source electrode so as to cause a change in the input and output interelectrode capacities exhibited by said transistor, thereby to effect a change in the oscillator circuit frequency of oscillation.

References Cited

UNITED STATES PATENTS 3,333,115 7/1967 Kawakami ---------- 307—304

OTHER REFERENCES

Butler: "Applications of Metal Oxide Silicon Transistors," Wireless World, February 1965, pp. 58–61.

Hanchett: "The Field-Effect Transistor as a Stable V.F.O. Element,"QST, December 1966, pp. 11, 12.

ROY LAKE, *Primary Examiner.*

SIEGFRIED H. GRIMM, *Assistant Examiner.*

U.S. Cl. X.R.

307—304; 331—177; 332—30